(12) United States Patent
Hsiao et al.

(10) Patent No.: US 9,997,633 B2
(45) Date of Patent: Jun. 12, 2018

(54) SEMICONDUCTOR DEVICES, FINFET DEVICES AND METHODS OF FORMING THE SAME

(71) Applicant: Taiwan Semiconductor Manufacturing Co., Ltd., Hsinchu (TW)

(72) Inventors: Ru-Shang Hsiao, Hsinchu County (TW); Chii-Ming Wu, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days. days.

(21) Appl. No.: 15/071,206

(22) Filed: Mar. 16, 2016

(65) Prior Publication Data

US 2017/0098711 A1 Apr. 6, 2017

Related U.S. Application Data

(60) Provisional application No. 62/236,145, filed on Oct. 2, 2015.

(51) Int. Cl.

| *H01L 27/088* | (2006.01) |
| *H01L 29/78* | (2006.01) |
| *H01L 21/306* | (2006.01) |
| *H01L 21/3065* | (2006.01) |
| *H01L 21/308* | (2006.01) |
| *H01L 29/66* | (2006.01) |
| *H01L 21/8234* | (2006.01) |

(52) U.S. Cl.
CPC ........ *H01L 29/7856* (2013.01); *H01L 21/308* (2013.01); *H01L 21/3065* (2013.01); *H01L 21/30604* (2013.01); *H01L 29/66545* (2013.01); *H01L 29/66795* (2013.01); *H01L 29/785* (2013.01); *H01L 21/823456* (2013.01); *H01L 27/0886* (2013.01)

(58) Field of Classification Search
CPC .................... H01L 27/0886; H01L 21/823456
USPC ........................................................ 257/330
See application file for complete search history.

(56) References Cited

U.S. PATENT DOCUMENTS

| 2006/0017099 A1* | 1/2006 | Paik ................... H01L 21/28114 257/330 |
| 2007/0218661 A1* | 9/2007 | Shroff ............... H01L 21/82341 438/510 |
| 2008/0157194 A1* | 7/2008 | Lee ................... H01L 21/76232 257/334 |
| 2009/0256191 A1* | 10/2009 | White ................... B82Y 10/00 257/319 |
| 2011/0248328 A1* | 10/2011 | Shen ................. H01L 21/28273 257/316 |
| 2012/0299100 A1* | 11/2012 | Ota ......................... H01L 29/00 257/347 |
| 2014/0183599 A1* | 7/2014 | Hong .................... H01L 29/785 257/190 |

(Continued)

*Primary Examiner* — George Fourson, III
(74) *Attorney, Agent, or Firm* — JCIPRNET

(57) ABSTRACT

Semiconductor devices, FinFET devices and methods of forming the same are disclosed. One of the semiconductor devices includes a substrate and a gate over the substrate. Besides, the gate include a first portion, a second portion overlying the first portion and a third portion overlying the second portion, and the critical dimension of the second portion is smaller than each of the critical dimension of the first portion and the critical dimension of the third portion.

17 Claims, 11 Drawing Sheets

(56) References Cited

U.S. PATENT DOCUMENTS

| | | | |
|---|---|---|---|
| 2015/0115363 A1* | 4/2015 | Chang | H01L 21/82343 257/347 |
| 2016/0005757 A1* | 1/2016 | Sakuma | H01L 21/28273 438/287 |
| 2016/0064567 A1* | 3/2016 | Ho | H01L 29/7851 257/411 |
| 2016/0293697 A1* | 10/2016 | Kim | H01L 29/0653 |

* cited by examiner

SEMICONDUCTOR DEVICES, FINFET DEVICES AND METHODS OF FORMING THE SAME

CROSS-REFERENCE TO RELATED APPLICATION

This application claims the priority benefits of U.S. provisional application Ser. No. 62/236,145, filed on Oct. 2, 2015. The entirety of the above-mentioned patent application is hereby incorporated by reference herein and made a part of this specification.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-type field-effect transistor (FinFET), has been introduced to replace a planar transistor. Although existing FinFET devices and methods of forming FinFET devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

FIG. 1H-1 is a schematic perspective view of a FinFET device in accordance with alternative embodiments.

DETAILED DESCRIPTION

Figure 1A:
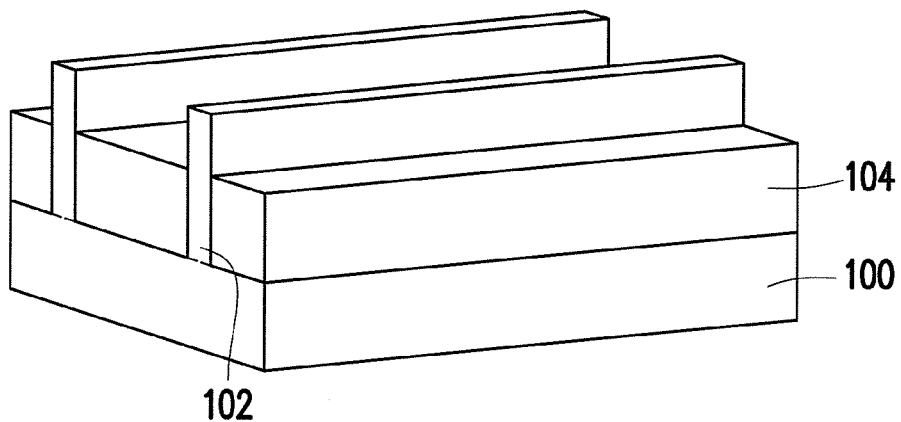
FIG. 1A to FIG. 1H are schematic perspective views of a method of forming a FinFET device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1H are schematic perspective views of a method of forming a FinFET device in accordance with some embodiments.

Referring to FIG. 1A, a substrate 100 with one or more fins 102 thereon is provided. In some embodiments, the substrate 100 is a semiconductor substrate, such as a silicon substrate, a silicon-on-insulator (SOI) substrate, a silicon germanium substrate, or a substrate formed of other suitable semiconductor materials. Depending on the requirements of design, the substrate 100 may be a P-type substrate or an N-type substrate and may have doped regions therein. The doped regions may be configured for an N-type FinFET device or a P-type FinFET device. In some embodiments, the one or more fins 102 extend in a first direction.

In some embodiments, the method of forming the substrate 100 with fins 102 includes forming a mask layer on a bulk substrate, and removing a portion of the bulk substrate by using the mask layer as an etch mask. In alternative embodiments, the method of forming the substrate 100 with fins 102 includes performing a sidewall image transfer (SIT) technique. In some embodiments, the fins 102 are oxidized to form stop layers respectively on surfaces of the fins 102, and the stop layers are configured for the following dummy gate removal step.

Still referring to FIG. 1A, the substrate 100 further has an isolation layer 104 formed thereon. In some embodiments, the isolation layer 104 covers lower portions of the fins 102 and exposes upper portions of the fins 102. In some embodiments, the isolation layer 104 is a shallow trench isolation (STI) structure. The isolation layer 104 includes a dielectric material such as silicon oxide. The method of forming the isolation layer 104 includes forming an isolation material layer covering the fins 102, and removing a portion of the isolation material layer with chemical mechanical polishing (CMP) and/or etching back.

In some embodiments, the fins 102 are active fins and are formed before the formation of the isolation layer. In alternative embodiments, the fins 102 are dummy fins and are replaced with active fins after the formation of the isolation layer. Besides, the fins 102 include a material the same as or different from that of the substrate 100.

Figure 1B:
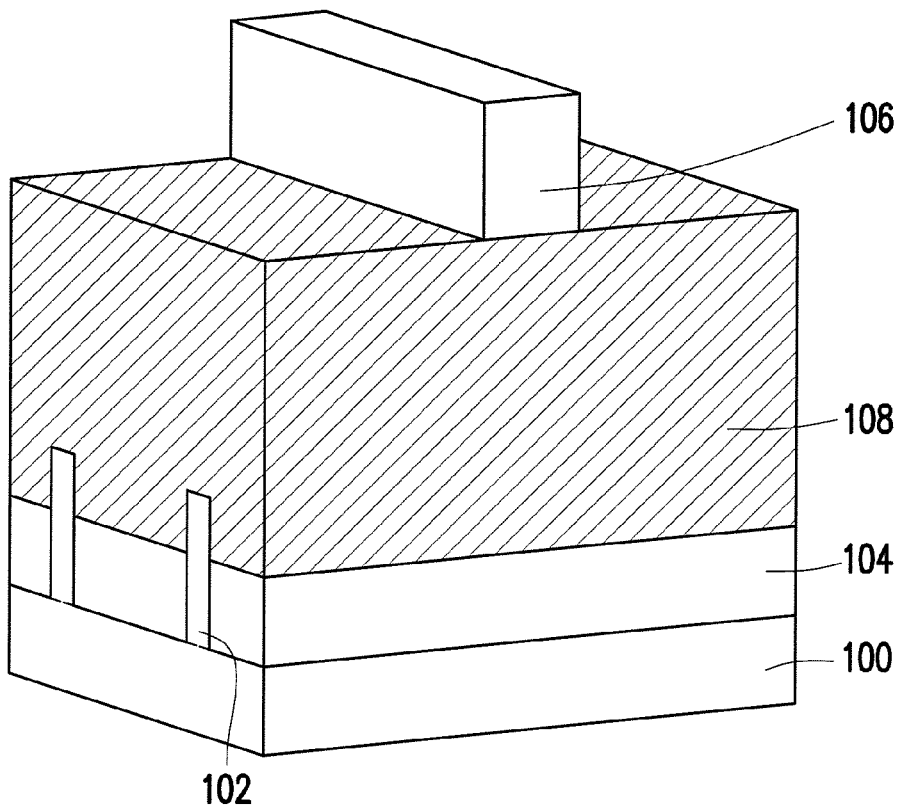

Referring to FIG. 1B, a dummy layer 108 is formed on the substrate 100 covering the fins 102 and the isolation layer 104. In some embodiments, the dummy layer 108 includes a silicon-containing material such as polysilicon, amorphous silicon or a combination thereof. In some embodiment, the dummy layer 108 further includes a cap layer (not shown) over the silicon-containing material. The method of forming the dummy layer 108 includes performing at least one suitable deposition process such as chemical vapor deposition (CVD), physical vapor deposition (PVD), atomic layer deposition (ALD), high density plasma CVD (HDPCVD), remote plasma CVD (RPCVD), plasma enhanced CVD (PECVD), a combination thereof or the like.

Thereafter, at least one mask layer 106 is formed over the dummy layer 108. In some embodiments, the mask layer 106 extends in a second direction different from the first direction. In some embodiments, the mask layer 106 includes a photoresist material, a dielectric material or a combination thereof. For example, the mask layer 106 is a tri-layer photoresist including a bottom layer such as a carbon/oxygen-containing layer, a middle layer such as a hard-mask layer above the bottom layer and a photoresist layer above the middle layer. In some embodiments, the mask layer 106 is formed by a suitable process such as spin-coating, PVD, CVD, ALD or a combination thereof, and followed by photolithography etching processes.

Figure 1C:
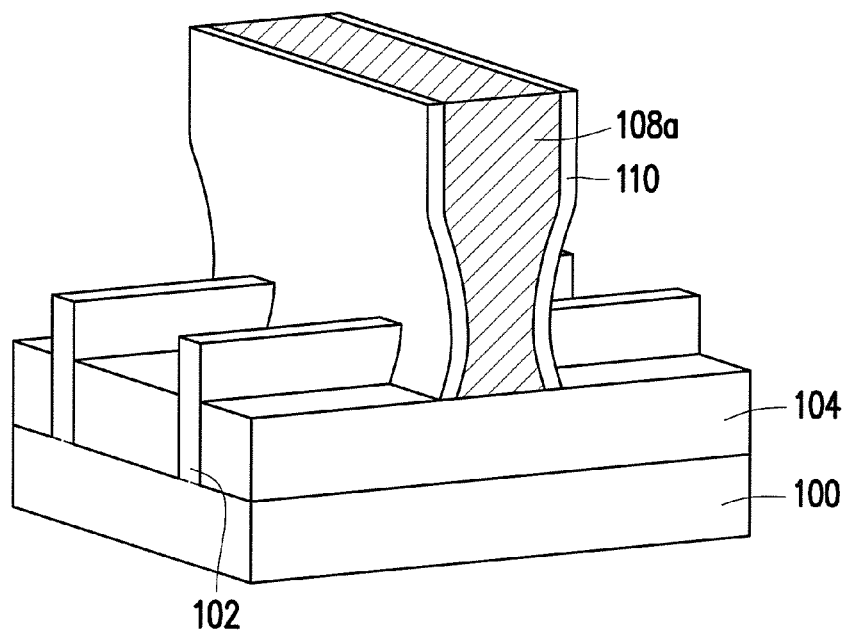

Referring to FIG. 1C, at least one main etching step (or called "patterning step") and at least one lateral etching step (or called "trimming step") are performed to the dummy layer 108 by using the mask layer 106 as an etch mask, so as to form a dummy gate 108a with a narrow-middle profile. In other words, the dummy layer 108 is patterned and trimmed to form the dummy gate 108a that is narrow in the middle portion thereof. In some embodiments, a breakthrough etching and an over-etching are included in the step of pattering and trimming the dummy layer 108.

The dummy gate 108a is formed across the fins 102. In some embodiments, the dummy gate 108a extends in a direction different from (e.g., perpendicular to) the extending direction of the fins 102. Each of the at least one main etching step and the at least one lateral etching step includes an anisotropic etching, an isotropic etching, a reactive ion etching (RIE) process, or a combination thereof. In some embodiments, each of the at least one main etching step and the at least one lateral etching step is a multi-step etching process.

In some embodiments, the at least one main etching is conducted to form a dummy preform with substantially vertical sidewalls or inclined sidewalls. Specifically, the dummy preform has a pillar-shaped profile, an inverted-trapezoid profile or the like. In some embodiments, the at least one lateral etching is conducted to narrow the middle portion and optionally trim the bottom portion of the dummy preform, so that the dummy gate 108a is formed with a narrow middle and a wide top. Specifically, the dummy gate has a vase-shaped profile, an hourglass-shaped profile or a Coca-Cola glass shaped profile or the like.

In some embodiments, the at least one main etching step and the at least one lateral etching step are performed in the same chamber. In alternative embodiments, the at least one main etching step and the at least one lateral etching step are performed in different chambers. Besides, the etching parameters such as etching gas species, etching gas composition ratio, gas flow rate, RF power and/or process time for each of the main etching step and the lateral etching step can be adjusted as needed, as long as the dummy gate 108a is formed with a narrow-middle profile. The mask layer 106 is then removed.

In some embodiments, the narrow-middle profile indicates a profile that is narrow in a middle portion thereof. For example, the middle portion is the narrowest portion of the narrow-middle profile. It is noted that, in some embodiments, the middle portion is not necessary to be the center portion of the dummy gate 108a, but merely the narrowest portion in the middle between the top and the bottom.

Figure 2:
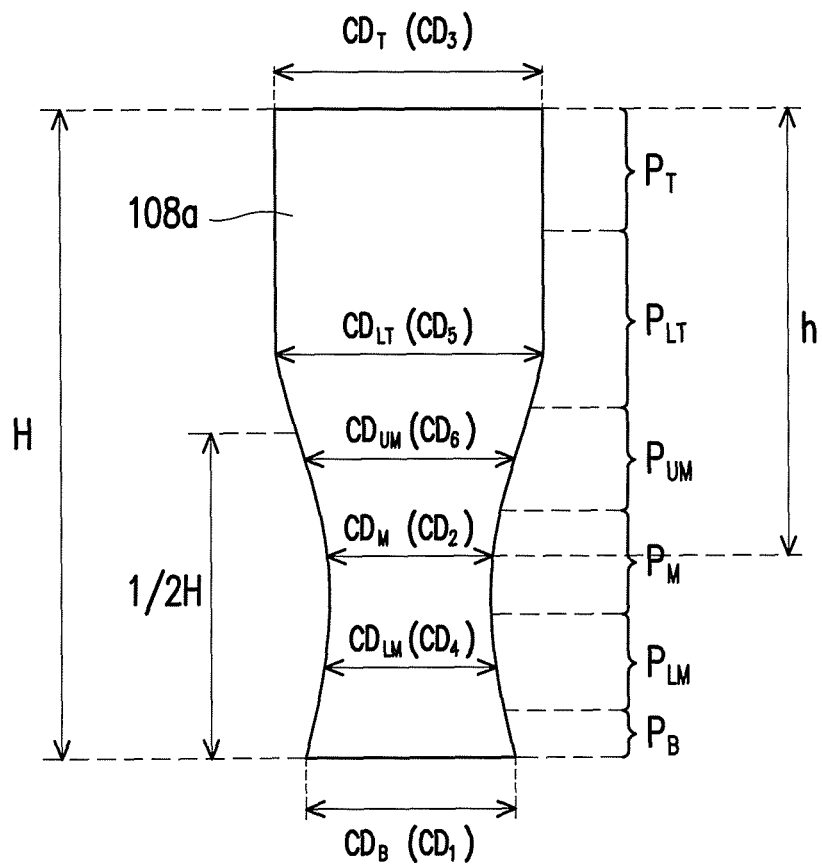
FIG. 2 and FIG. 3 are enlarged local cross-sectional views showing different stages of a method of forming a FinFET device in accordance with some embodiments.

FIG. 2 is the enlarged cross-sectional view of the dummy gate 108a. In some embodiments, as shown in FIG. 2, the dummy gate 108a includes a first or bottom portion $P_B$, a second or medium portion $P_M$, and a third or top portion $P_T$. Specifically, the second or medium portion $P_M$ is overlying the first or bottom portion $P_B$, and the third or top portion $P_T$ is overlying the second or medium portion $P_M$. The critical dimension $CD_2$ or $CD_M$ of the second or middle portion $P_M$ is smaller than each of the critical dimension $CD_1$ or $CD_B$ of the first or bottom portion $P_B$ and the critical dimension $CD_3$ or $CD_T$ of the third or top portion $P_T$. In some embodiments, the critical dimension $CD_3$ or $CD_T$ is no less than the critical dimension $CD_1$ or $CD_B$. For example, the critical dimension $CD_3$ or $CD_T$ is greater than the critical dimension $CD_1$ or $CD_B$.

In some embodiments, the middle portion $P_M$ of the dummy gate 108a is no higher than about half (½) of the height H of the dummy gate 108a. However, the present disclosure is not limited thereto. In alternative embodiments, upon the process requirements, the middle portion $P_M$ of the dummy gate 108a can be higher than half of the height H of the dummy gate 108a.

In some embodiments, the middle portion $P_M$ corresponds to the tops of the fins 102. In some embodiments, the critical dimension $CD_2$ or $CD_M$ of the second or middle portion $P_M$ is at a level substantially the same as the tops of the fins 102. In alternative embodiments, the critical dimension $CD_2$ or $CD_M$ of the second or middle portion $P_M$ is at a level higher or lower than the tops of the fins 102.

In some embodiments, the middle portion $P_M$ is referred to as a "waist portion" of the element, the top portion $P_T$ is referred to as a "shoulder portion" of the same, and the bottom portion $P_B$ is referred to as a "base portion" of the same. In some embodiments, the dummy gate 108a can be described as having a broad shoulder and a narrow waist.

In some embodiments, the dummy gate 108a further includes a fourth or lower-medium portion $P_{LM}$ between the first or bottom portion $P_B$ and the second or medium portion $P_M$, and the critical dimension $CD_{LM}$ of the fourth or lower-medium portion $P_{LM}$ is less than the critical dimension $CD_1$ or $CD_B$ of the first or bottom portion $P_B$ while greater than the critical dimension $CD_2$ or $CD_M$ of the second or medium portion $P_M$.

In some embodiments, the dummy gate 108a further includes a fifth or lower-top portion $P_{LT}$ between the second or medium portion $P_M$ and the third or top portion $P_T$, and the critical dimension $CD_5$ or $CD_{LT}$ of the fifth or lower-top portion $P_{LT}$ is between the critical dimension $CD_2$ or $CD_M$ of the second or medium portion $P_M$ and the critical dimension $CD_3$ or $CD_{BT}$ of the third or top portion $P_T$. In some embodiments, the critical dimension $CD_{LT}$ is at a level about ⅖ to ⅗ (e.g., ½) of the height h from the level of the critical dimension $CD_M$ to the level of the critical dimension $CD_T$.

In some embodiments, the dummy gate 108a further includes a sixth or upper-medium portion $P_{UM}$ between the second or medium portion $P_M$ and the fifth or lower-top portion $P_{LT}$, and the critical dimension $CD_6$ or $CD_{UM}$ of the sixth or upper-medium portion $P_{UM}$ is between the critical dimension $CD_2$ or $CD_M$ of the second or medium portion $P_M$ and the critical dimension $CD_5$ or $CD_{LT}$ of the fifth or lower-top portion $P_{LT}$. In some embodiments, the critical dimension $CD_{UM}$ is at a level about 1/5 to 2/5 (e.g., 3/10) of the height h from the level of the critical dimension $CD_M$ to the level of the critical dimension $CD_T$.

In view of the above, in some embodiments, the dummy gate 108a includes, the bottom portion $P_B$, the lower-medium portion $P_{LM}$, the medium portion $P_M$, the upper-medium portion $P_{UM}$, the lower-top portion $P_{LT}$ and the top portion $P_T$ which are connected in sequence. In some embodiments, the dummy gate 108a has a smooth outline or contour and the middle portion $P_M$ is the narrowest portion thereof.

In some embodiments, the relationship between the critical dimensions of said portions of the dummy gate 108a is as follows.

$$CD_T(CD_3) > CD_{LT}(CD_5) > CD_{UM}(CD_6) \approx CD_B(CD_1) > CD_{LM}(CD_4) > CD_M(CD_2)$$

In some embodiments, when the critical dimension $CD_T$ ($CD_3$) is used as a benchmark or standard, the critical dimension $CD_{LT}(CD_5)$ is about 0.935 to 0.999 of the critical dimension $CD_T(CD_3)$, the critical dimension $CD_{UM}(CD_6)$ is about 0.888 to 0.982 of the critical dimension $CD_T(CD_3)$, the critical dimension $CD_M(CD_2)$ is about 0.815 to 0.901 of the critical dimension $CD_T(CD_{13})$, the critical dimension $CD_{LM}(CD_4)$ is about 0.837 to 0.925 of the critical dimension $CD_T(CD_3)$, and the critical dimension $CD_B(CD_{11})$ is about 0.887 to 0.981 of the critical dimension $CD_T(CD_3)$. However, the disclosure is not limited thereto. Specifically, the relationship between the critical dimensions of said portions of the dummy gate 108a can be adjusted as needed, as long as the dummy gate 108a is formed with a narrow-middle profile.

Still referring to FIG. 1C, spacers 110 are formed on sidewalls of the dummy gate 108a. In some embodiments, the spacers 110 are formed conformally along the sidewalls of the dummy gate 108a. That is, each of the spacers 110 is a curvy spacer. In some embodiments, the spacers 110 include a nitrogen-containing dielectric material, a carbon-containing dielectric material or both, and the spacers have a dielectric constant less than about 10, less than 9, less than 8, less than about 7, less than about 6 or even less than about 5. In some embodiments, the spacers 110 includes SiN, SiCN, SiOCN, SiOR (wherein R is an alkyl group such as $CH_3$, $C_2H_5$ or $C_3H_7$), SiC, SiOC, SiON, a combination thereof or the like. In some embodiments, the spacers 110 are made of a single material. In alternative embodiments, each of the spacers 110 is a multi-layer structure.

In some embodiments, a spacer material layer is formed on the isolation layer 104 covering the dummy gate 108a. The method of forming the spacer material layer includes performing at least one suitable deposition process such as CVD, PVD, ALD, HDPCVD, RPCVD, PECVD, a combination thereof or the like. At least one anisotropic etching process is then performed to remove a portion of the spacer material layer.

Figure 1D:
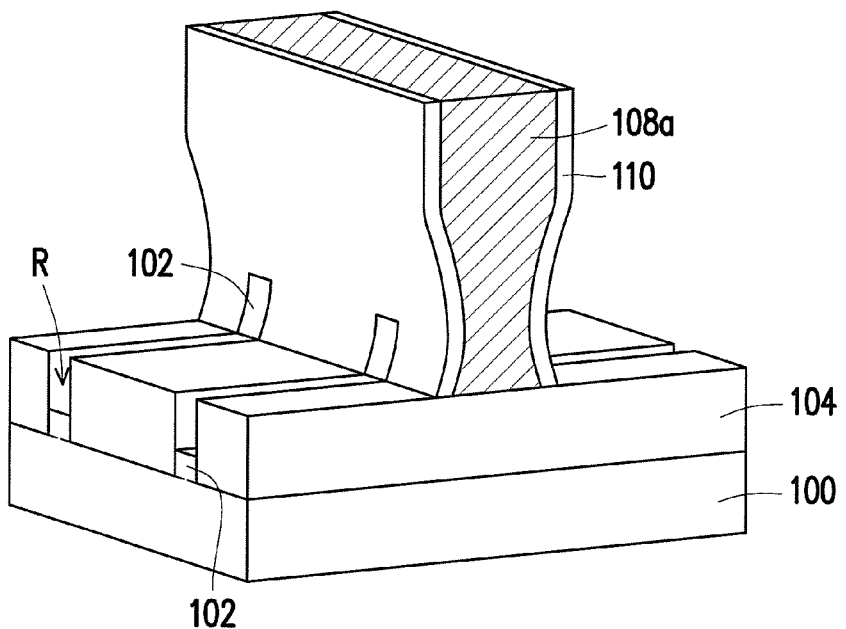
Figure 1E:
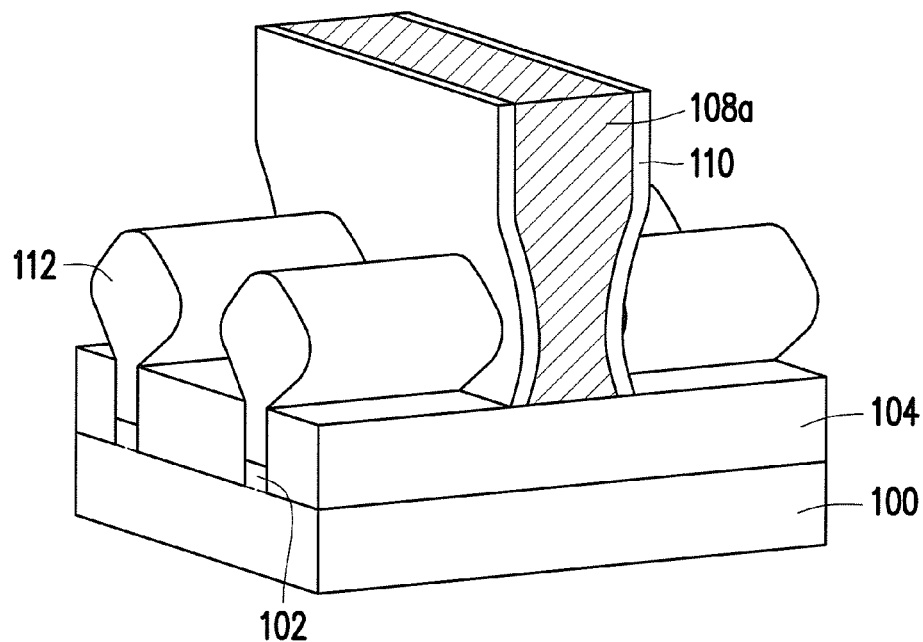

Referring to FIG. 1D and FIG. 1E, multiple source/drain regions 112 are formed at two opposite sides of the dummy gate 108a. Specifically, two source/drain regions 112 are formed at both sides of each fin 102. In some embodiments, the exposed upper portions of the fins 102 are removed by using a suitable technique such as an anisotropic etching process, and therefore, recesses R are formed in the isolation layer 104, as shown in FIG. 1D. In some embodiments, the exposed upper portions of the fins 102 are removed by using the dummy gate 108a and the spacers 110 as an etch mask. That is, the step of forming the recesses R is considered a self-aligned etching step.

Figure 3:
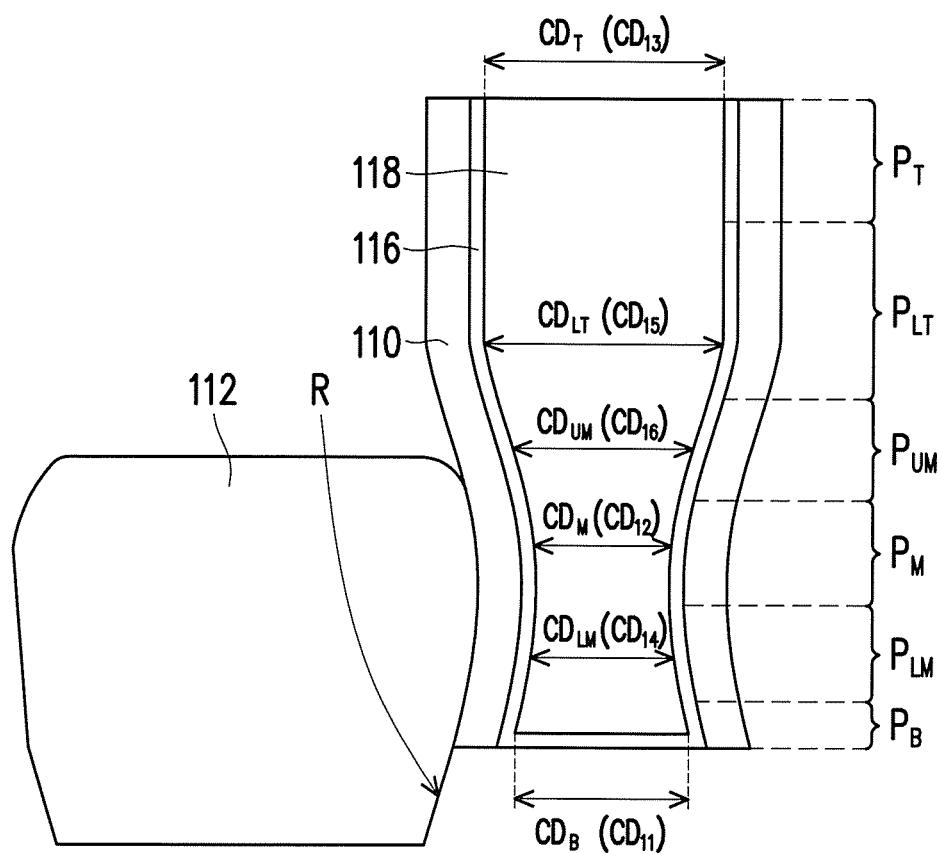

It is noted that, in some embodiments, the dummy gate 108a is formed with a wide top and a narrow middle, so the broader top portion thereof serves as a shielding mask to prevent the bottoms of the spacers 110 from being damaged during the recess forming step. Therefore, the conventional undercuts at bottoms of the spacers are not observed, and thus the process window and therefore the device performance are effectively improved. In other words, the broader top portion of the dummy gate 108a protects the spacers 110 from being damaged by the etching gas or etchant used in the recess forming step. In some embodiments, the bottoms of the spacers 110 remain substantially intact after the recess forming step. In some embodiments, the recesses R are formed with inclined sidewalls rather than the conventional vertical sidewalls, as shown in FIG. 3. For example, the sidewalls of the recesses R are inclined away from the bottoms of the spacers 110. In some embodiments, an enlarging step and/or a rounding step can be included after the recess forming step, so the resulting recess profile can have a diamond-like shape, a bucket-like shape or the like.

Thereafter, the source/drain regions 112 are formed by selectively growing epitaxy layers from the recesses R, as shown in FIG. 1E. Specifically, the source/drain regions 112 are formed within the recesses R and extend upwardly along the sidewalls of the corresponding spacers 110. In some embodiments, the sidewalls of the source/drain regions 112 in the substrate 100 are inclined away from bottoms of the spacers 110. In some embodiments, the tops of the source/drain regions 112 is above the middle portion of the dummy gate 108a. In alternative embodiments, the tops of the source/drain regions 112 is substantially level with or lower than the middle portion of the dummy gate 108a.

In some embodiments, the source/drain regions 112 include silicon germanium, silicon carbon or silicon phosphate. In some embodiments, the source/drain regions 112 include silicon germanium (SiGe) for a P-type FinFET device. In alternative embodiments, the source/drain regions 112 include silicon carbon (SiC), silicon phosphate (SiP), SiCP or a SiC/SiP multi-layer structure for an N-type FinFET device. In some embodiments, the source/drain regions 112 may be optionally implanted with an N-type dopant or a P-type dopant as needed. Following the formation of the source/drain regions 112, silicide regions (not shown) may be formed by siliciding the top portions of the source/drain regions 112.

Figure 1F:
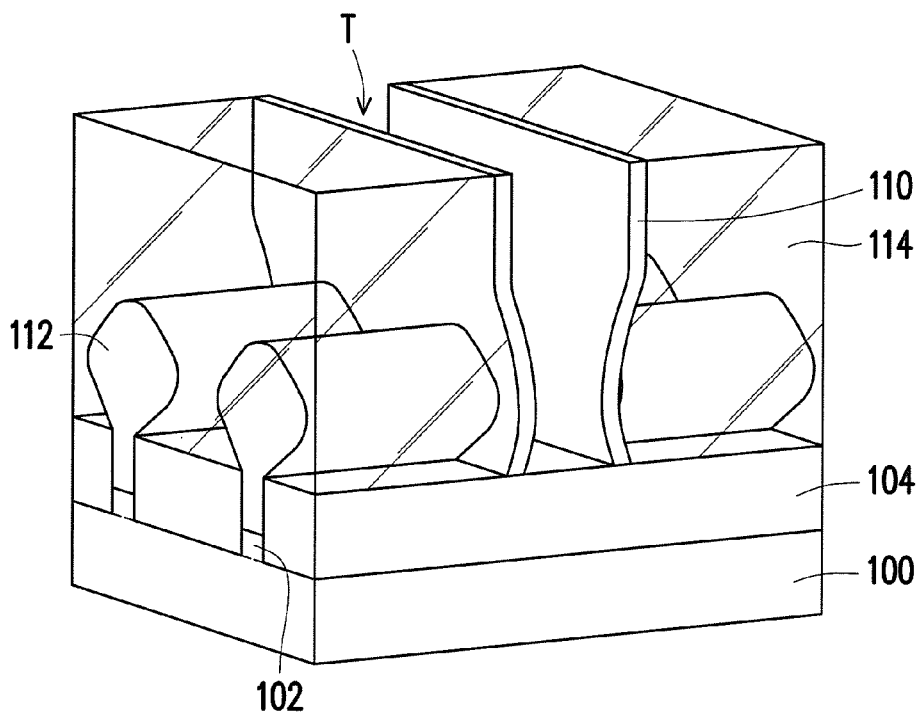

Referring to FIG. 1F, a dielectric layer 114 is formed aside or around the dummy gate 108a. The dielectric layer 114 includes a nitride such as silicon nitride, an oxide such as silicon oxide, phosphosilicate glass (PSG), borosilicate glass (BSG), boron-doped phosphosilicate glass (BPSG), a combination thereof or the like. In some embodiments, the dielectric layer 114 is made of a single material. In alternative embodiments, the dielectric layer 114 includes a multi-layer structure. The dielectric layer 114 may be filled until its top surface is higher than the top surface of the dummy gate 108a by a suitable fabrication technique such as spin-coating, CVD, flowable CVD, PECVD, ALD, a combination or the like. A planarization step such as CMP is then performed to remove the excess dielectric layer. In some embodiments, the dummy gate 108a is used as a polish stop layer, so that the top surface of the dielectric layer 114 is substantially level with the top surface of the dummy gate 108a. In some embodiments, a contact etch stop layer (CESL) is formed after the step of forming the source/drain regions 112 and before the step of forming the dielectric layer 114, and the CESL includes SiN, SiC or the like.

Thereafter, the dummy gate 108a is removed to form a trench T in the dielectric layer 114. The removing step includes performing a suitable etching process. In some embodiments, the stop layers on the surfaces of the fins 102 are simultaneously removed during the step of removing the dummy gate 108a. In alternative embodiments, the stop layers on the surfaces of the fins 102 are substantially intact during the step of removing the dummy gate 108a. In some embodiments, the trench T has a shape/profile the same as that of dummy gate 108a. Specifically, the trench T has a narrow-middle profile. In some embodiments, the trench T provided with a wide top and a narrow middle is beneficial to improve the filling quality of the subsequent metal filling step. That is, the subsequently formed metal layer 118 can be filled in the trench T easily without generation a void therein because the top of the trench T is widened.

Figure 1G:
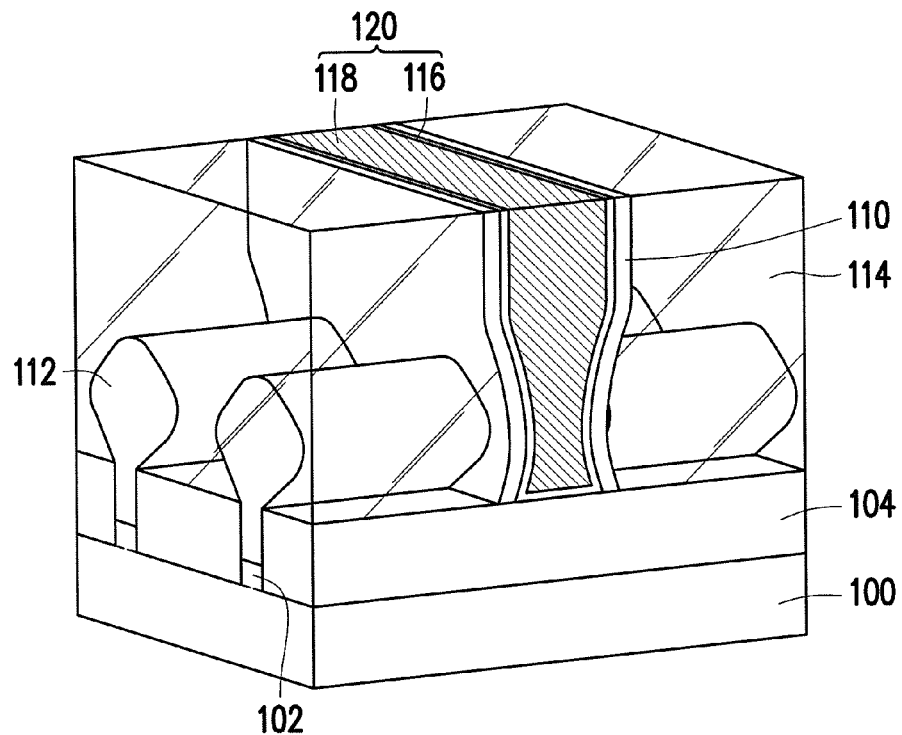

Referring to FIG. 1G, a gate 120 (or called "replacement gate") is formed in the trench T. In some embodiments, the gate 120 includes a gate dielectric layer 116 formed on the sidewall and bottom of the trench T and on the tops and sidewalls of the fins 102, and a metal layer 118 filling the remaining trench T.

In some embodiments, the gate dielectric layer 116 includes silicon oxide, silicon oxyntirde, a dielectric material having a dielectric constant greater than about 7 or even greater than about 10 (referred to as "a high-k material" throughout the description), or a combination thereof. In some embodiments, the high-k material includes metal oxide such as HfO, LaO, AlO, ZrO, TiO, $Ta_2O_5$, $Y_2O_3$, STO, BTO, BaZrO, HfZrO, HfLaO, HfTaO, HfTiO, a combination thereof, or a suitable material. In alternative embodiments, the high-k material can optionally include a silicate such as HfSiO, LaSiO, AlSiO, a combination thereof, or a suitable material. The method of forming the gate dielectric layer 116 includes performing molecular-beam deposition (MBD), CVD, ALD, PVD, or the like. In some embodiments, an oxide layer such as a silicon oxide layer may be formed between the high-k material and each of the fins 102 through a thermal oxidation process.

In some embodiments, the metal layer 118 includes TiN, TaC, TaN, TaSiN, HfN, $ZrSi_2$, $MoSi_2$, $TaSi_2$, $NiSi_2$, WN or the like. When the device of the disclosure is an N-type FinFET device, the metal layer 118 includes an N-type work function metal material. When the device of the disclosure is a P-type FinFET device, the metal layer 118 includes a P-type work function metal material. The metal layer 118 is formed by a suitable deposition technique such as CVD, ALD, PVD, sputtering, plating, a combination thereof or the like.

In the disclosure, the gate 120 replaces the dummy gate 108a, so the gate 120 has a shape/profile similar to that of dummy gate 108a. Specifically, the gate 120 has a narrow-middle profile.

FIG. 3 is the enlarged cross-sectional view of the spacers 110, the source/drain regions 112 and the gate 120. In some embodiments, as shown in FIG. 3, the gate 120 includes a bottom portion $P_B$, a lower-medium portion $P_{LM}$, a medium portion $P_M$, an upper-medium portion $P_{UM}$, a lower-top portion $P_{LT}$ and a top portion $P_T$ which are connected in sequence. In some embodiments, the gate 120 has a smooth outline or contour and the middle portion $P_M$ is the narrowest portion thereof. In some embodiments, the middle portion $P_M$ of the gate 120 is no higher than half of the height of the gate 120.

In some embodiments, the relationship between the critical dimensions of said portions of the gate 120 is as follows.

$$CD_T(CD_{13}) > CD_{LT}(CD_{15}) > CD_{UM}(CD_{16}) \approx CD_B(CD_{11}) > CD_{LM}(CD_{14}) > CD_M(CD_{12})$$

In some embodiments, when the critical dimension $CD_T$ ($CD_{13}$) is used as a benchmark or standard, the critical dimension $CD_{LT}$ ($CD_{15}$) is about 0.935 to 0.999 of the critical dimension $CD_T$ ($CD_{13}$), the critical dimension $CD_{UM}$ ($CD_{16}$) is about 0.888 to 0.982 of the critical dimension $CD_T$ ($CD_{13}$), the critical dimension $CD_M$ ($CD_{12}$) is about 0.815 to 0.901 of the critical dimension $CD_T$ ($CD_{13}$), the critical dimension $CD_{LM}$ ($CD_{14}$) is about 0.837 to 0.925 of the critical dimension $CD_T$ ($CD_{13}$), and the critical dimension $CD_B$ ($CD_{11}$) is about 0.887 to 0.981 of the critical dimension $CD_T$ ($CD_{13}$). However, the disclosure is not limited thereto. Specifically, the relationship between the critical dimensions of said portions of the gate 120 can be adjusted as needed, as long as the gate 120 is formed with a narrow-middle profile.

Figure 1H:
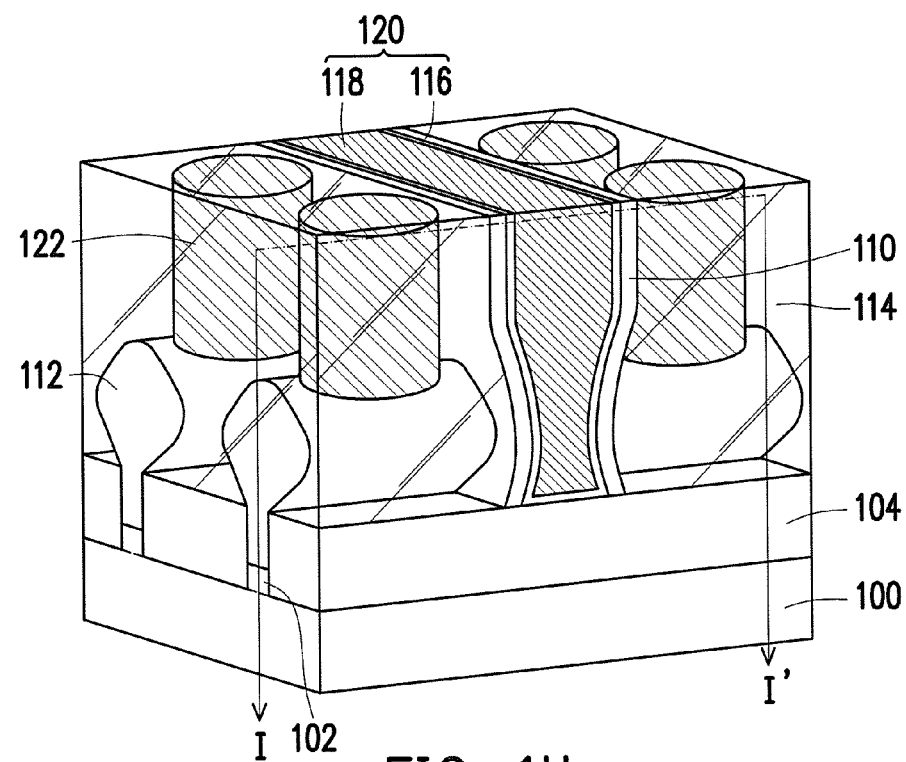

Referring to FIG. 1H, at least two contacts 120 are formed in the dielectric layer 114 and electrically connected to the corresponding source/drain regions 112. In some embodiments, multiple contact openings are formed through the dielectric layer 114 and portions of the source/drain regions 112, and the contacts 120 are then filled in the contact openings. In some embodiments, before the contacts 120 are formed, silicide layers are formed on bottom surfaces of the contact openings, and the silicide layers include $TiSi_x$, $NiSi_x$, $CoSi_x$ or the like, wherein x is greater than zero. In some embodiments, each of the contacts 120 includes a metal material (e.g., W, Cu, Al or an alloy thereof) and a diffusion barrier material (e.g., TiW, Ti, TiN, Ta, TaN or a combination thereof) aside and below the metal material. The FinFET device of the disclosure is thus completed.

Figures 1, 1H:
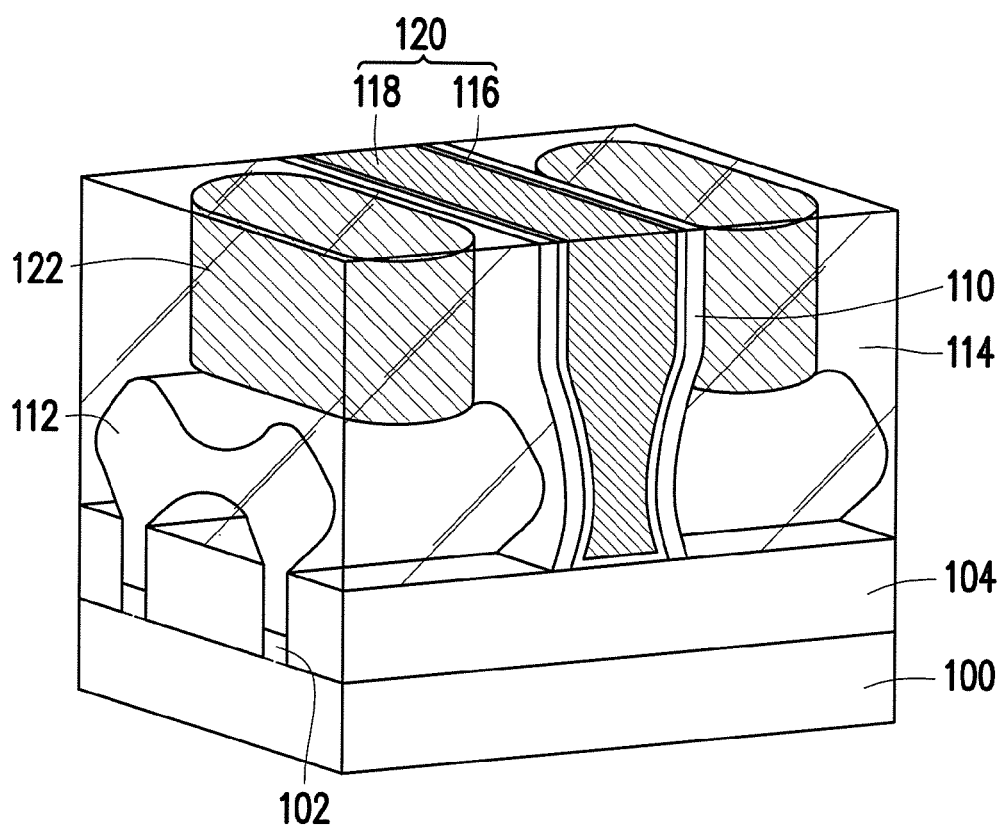

In some embodiments, the source/drain regions 112 are separate from each other, and the contacts 122 over the corresponding source/drain regions 112 are separated from each other, as shown in FIG. 1H. However, the present disclosure is not limited thereto. In alternative embodiments, the adjacent source/drain regions 112 at the same side of the gate 120 are connected, and contacts 122 with greater sizes are provided over the connected source/drain regions 112, so as to reducing the contact resistance, as shown in FIG. 1H-1.

Figure 4:
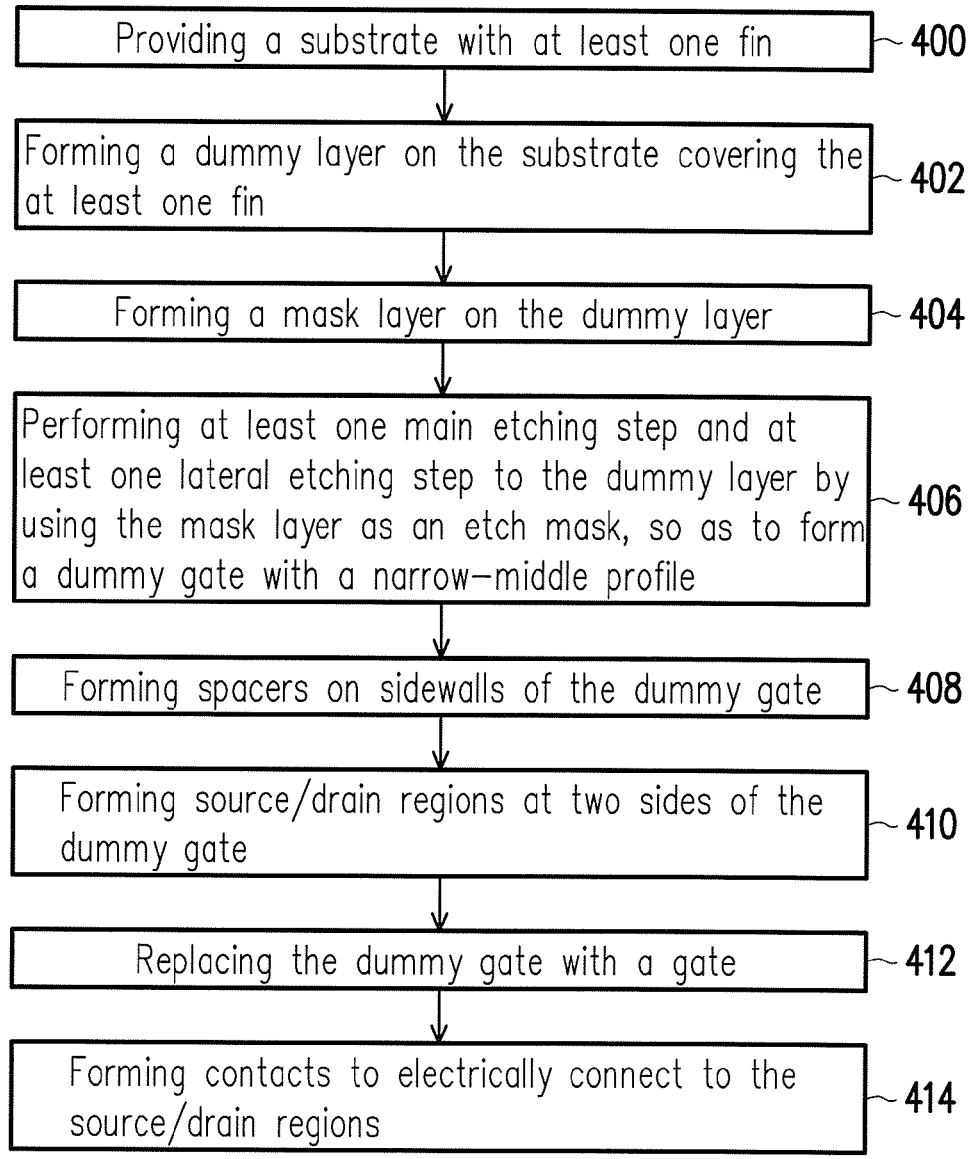
FIG. 4 is a flow chart of a method of forming a FinFET device in accordance with some embodiments.
Figure 5:
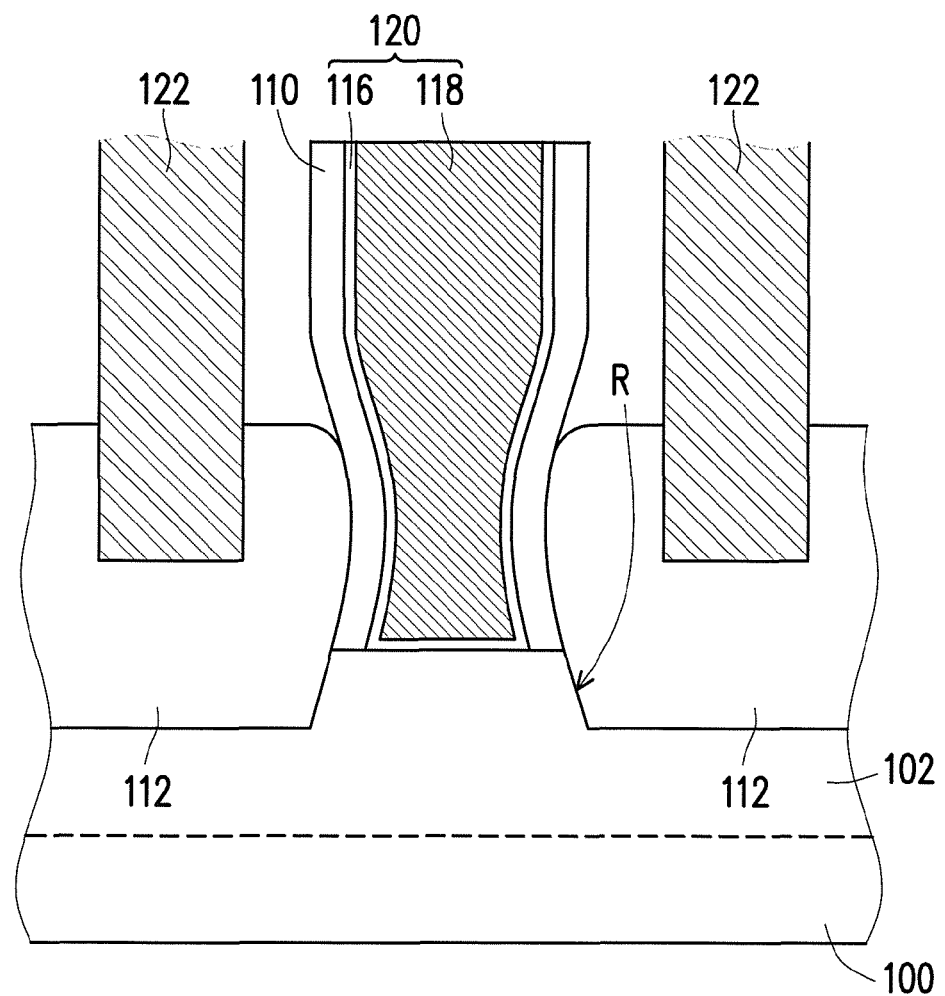
FIG. 5 is a cross-sectional view taken along the line I-I' of FIG. 1H.

The above-mentioned process steps can be concisely illustrated with reference to the flow chart of FIG. 4.

At step 400, a substrate 100 is provided with at least one fin 102 formed thereon, as shown in FIG. 1A. At step 402, a dummy layer 108 is formed on the substrate 100 covering the at least one fin 102, as shown in FIG. 1B. At step 404, a mask layer 106 is formed on the dummy layer 108, as shown in FIG. 1B. At step 406, at least one main etching step and at least one lateral etching step are performed to the dummy layer 108 by using the mask layer 106 as an etch mask, so as to form a dummy gate 108a with a narrow-middle profile, as shown in FIG. 1C. At step 408, spacers 110 are formed on sidewalls of the dummy gate 108a, as shown in FIG. 1C. At step 410, source/drain regions 112 are formed at two sides of the dummy gate 108a, as shown in FIG. 1D and FIG. 1E. At step 412, the dummy gate 108a is replaced with a gate 120, as shown in FIG. 1F to FIG. 1G. At step 414, contacts 120 are formed to electrically connect to the source/drain regions 112, as shown in FIG. 1H and FIG. 1H-1.

The structures of the FinFET devices of the disclosure are described with reference to FIG. 1H, FIG. 1H-1, FIG. 3 and FIG. 5.

In some embodiments, one of the FinFET devices includes a substrate 100 having at least one fin 102 and a gate 120 disposed across the at least one fin 102 and having a narrow-middle profile that is narrow in a middle portion thereof. In some embodiments, the gate 120 includes, from bottom to top, a bottom portion $P_B$, a lower-medium portion $P_{LM}$, a medium portion $P_M$, an upper-medium portion $P_{UM}$, a lower-top portion $P_{LT}$ and a top portion $P_T$. In some embodiments, the middle portion $P_M$ of the gate 120 is no higher than half of the height of the gate 120.

In some embodiments, the relationship between the critical dimensions of said portions of the gate 120 is as follows.

$$CD_T > CD_{LT} > CD_{UM} \approx CD_B > CD_{LM} > CD_M$$

wherein the bottom portion $P_B$ has a critical dimension $CD_B$, the lower-medium portion $P_{LM}$ has a critical dimension $CD_{LM}$, the medium portion $P_M$ has a critical dimension $CD_M$, the upper-medium portion $P_{UM}$ has a critical dimension $CD_{UM}$, the lower-top portion $P_{LT}$ has a critical dimension $CD_{LT}$, and the top portion $P_T$ has a critical dimension $CD_T$.

Besides, spacers 110, source/drain regions 112 and contacts 122 are further included in the FinFET device of the disclosure. The spacers 110 are disposed on the sidewalls of the gate 120 and include a nitrogen-containing dielectric material such as SiN, SiCN, SiOCN or a combination thereof. The source/drain regions 112 are disposed at two sides of the gate 120. In some embodiments, the sidewalls of the source/drain regions 112 in the substrate 100 are inclined away from bottoms of the spacers 110. The contacts 122 are formed over and electrically connected to the source/drain regions 112. In some embodiments, the bottom surfaces of the contacts 122 are no higher than the middle portion of the gate 120. In alternative embodiments, upon the process requirements, the bottom surfaces of the contacts 122 can be higher than the middle portion of the gate 120.

The said embodiments in which the method of the disclosure is applied to a FinFET device process is provided for illustration purposes, and are not construed as limiting the present disclosure. In alternative embodiments, the method of disclosure can be applied to a planar device process.

Figure 6:
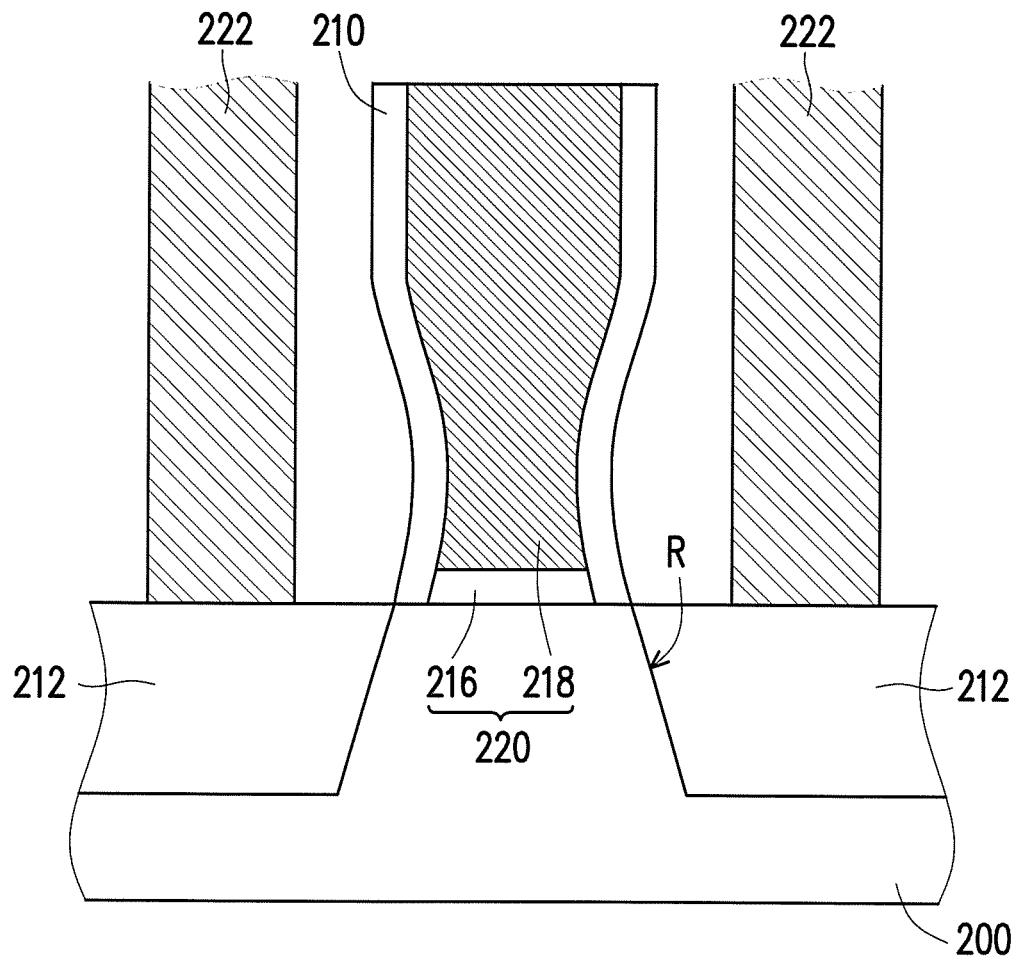
FIG. 6 is a cross-sectional view of a semiconductor device in accordance with alternative embodiments.

FIG. 6 is a cross-sectional view of a semiconductor device in accordance with alternative embodiments.

As shown in FIG. 6, a semiconductor device includes a planar substrate 200 and a gate 220, spacers 210, source/drain regions 212 and contacts 222. In some embodiments, the gate 220 is over the planar substrate 200 and has a narrow-middle profile that is narrow in a middle portion thereof. In some embodiments, the middle portion of the gate 220 is no higher than half of the height of the gate 220. In some embodiments, the gate 220 includes a gate dielectric layer 216 on the planar substrate 200 and a gate electrode 218 on the gate dielectric layer 216. In some embodiments, the gate dielectric layer 216 includes silicon oxide, a high-k material or a combination thereof. The gate electrode 218 includes a silicon-containing material, a metal-containing material or a combination thereof. In some embodiments, a gate dielectric material layer and a gate electrode material are sequentially formed on the planar substrate 200 and then subjected to a patterning and trimming step similar to that described in FIG. 1C, so as to form the gate 220 with a wide top and a narrow middle. Thereafter, the spacers 210 are formed conformally on the sidewalls of the gate electrode 218. Afterwards, recesses R are formed in the planar substrate 200 beside the gate electrode 218 and the source/drain regions 212 are filled in the recesses R. In some embodiments, the broader top portion of the gate electrode 218 protects bottoms of the spacers 210 from being damaged by the etching gas or etchant used in the recess forming step. The contacts 222 are then formed over the planar substrate 200 and electrically connected to the corresponding source/drain regions 212. A planar semiconductor device is thus completed.

Figure 7:
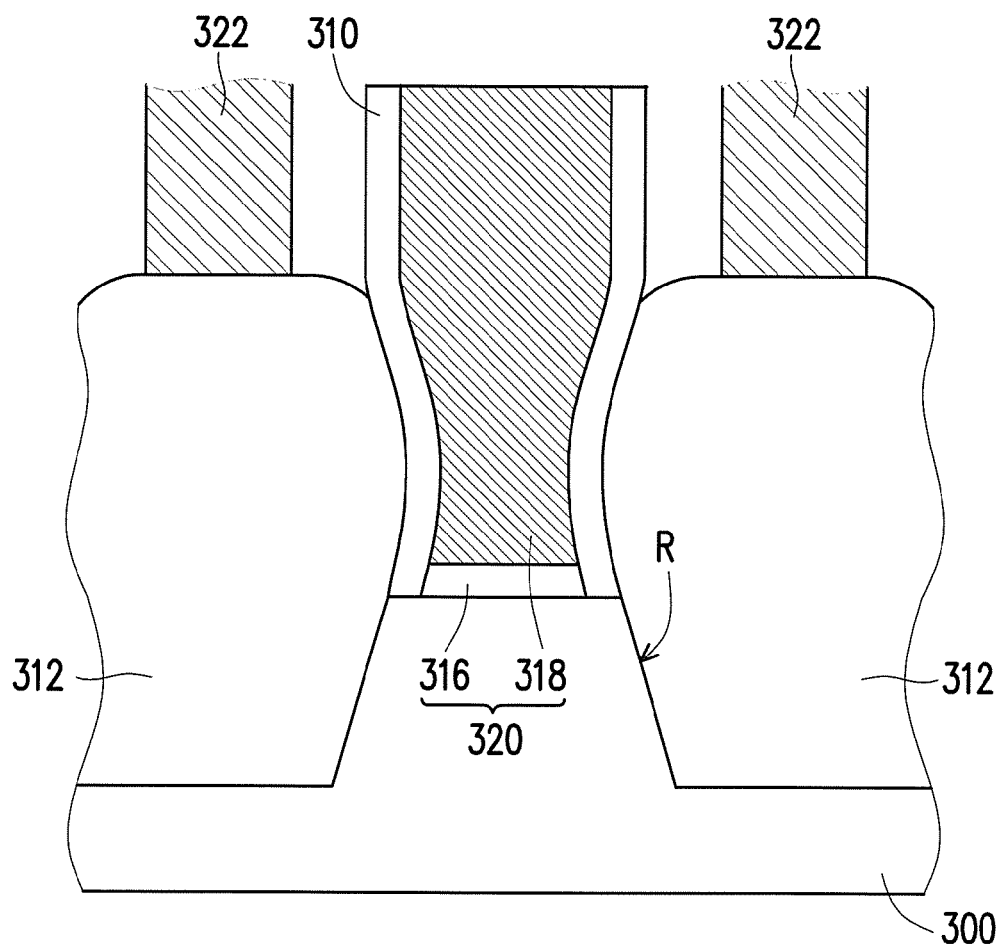
FIG. 7 is a cross-sectional view of a semiconductor device in accordance with yet alternative embodiments.

FIG. 7 is a cross-sectional view of a semiconductor device in accordance with yet alternative embodiments.

The semiconductor device of FIG. 7 is similar to that of FIG. 6, and the difference between them lies in that the source/drain regions 312 in FIG. 7 are raised epitaxial layers. In some embodiments, the tops of the source/drain regions 312 are higher than the narrow middle portion of the gate 320. In some embodiments, the tops of the source/drain regions 312 are as high as the lower-top portion of the gate 320. The planar substrate 300, gate 320, spacers 310, and contacts 322 are similar to the planar substrate 200, gate 220, spacers 210, and contacts 222, and the details are not iterated herein. Similarly, the broader top portion of the gate electrode 318 protects bottoms of the spacers 310 from being damaged by the etching gas or etchant used in the recess forming step.

In view of the above, in some embodiments, the gate is formed with a wide top/shoulder and a narrow middle/waist, so the broader top portion thereof serves as a shielding mask to prevent bottoms of the spacers from being damaged during the source/drain recess forming step. Therefore, the conventional undercuts at bottoms of the spacers are not observed. In some embodiments, the gate of the disclosure is provided with such specific Coca-Cola glass shape, and the narrow middle portion thereof is beneficial to reduce the gate-to-source/drain parasitic capacitance and the gate-to-contact parasitic capacitance. Thus, the operation speed and therefore the device performance are accordingly improved.

In accordance with some embodiments of the present disclosure, a semiconductor device includes a substrate and a gate over the substrate. Besides, the gate includes a first portion, a second portion overlying the first portion and a third portion overlying the second portion, and the critical dimension of the second portion is smaller than each of the critical dimension of the first portion and the critical dimension of the third portion.

In accordance with alternative embodiments of the present disclosure, a FinFET device includes a substrate having at least one fin and a gate disposed across the at least one fin. The gate has a narrow-middle profile that is narrow in a middle portion thereof. Besides, the middle portion of the gate is no higher than half of the height of the gate.

In accordance with yet alternative embodiments of the present disclosure, a method of forming a FinFET device includes at least the following steps. A substrate is provided with at least one fin. A dummy layer is formed on the substrate covering the at least one fin. A mask layer is formed on the dummy layer. At least one main etching step and at least one lateral etching step are performed to the dummy layer by using the mask layer as an etch mask, so as to form a dummy gate with a narrow-middle profile. Source/drain regions are formed at two sides of the dummy gate. The dummy gate is replaced with a gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate; and
   a gate over the substrate,
   wherein the gate comprises a first portion, a second portion overlying the first portion and a third portion overlying the second portion, and a critical dimension of the second portion is smaller than each of a critical dimension of the first portion and a critical dimension of the third portion,
   wherein the critical dimension of the third portion is greater than the critical dimension of the first portion.

2. The semiconductor device of claim 1, wherein the substrate is a substrate with at least one fin extending in a first direction, and the gate extends in a second direction different from the first direction and is across the at least one fin.

3. The semiconductor device of claim 1, wherein the substrate is a planar substrate.

4. The semiconductor device of claim 1, wherein the gate further comprises a fourth portion between the first portion and the second portion, and the critical dimension of the fourth portion is smaller than the critical dimension of the first portion while greater than the critical dimension of the second portion.

5. The semiconductor device of claim 4, wherein the gate further comprises a fifth portion between the second portion and the third portion, and the critical dimension of the fifth portion is between the critical dimension of the second portion and the critical dimension of the third portion.

6. The semiconductor device of claim 5, wherein the critical dimension of the fourth portion is less than the critical dimension of the fifth portion.

7. The semiconductor device of claim 1, further comprising spacers on sidewalls of the gate, wherein the spacers comprise a nitrogen-containing dielectric material, a carbon-containing dielectric material or both, and the spacers have a dielectric constant less than about 10.

8. The semiconductor device of claim 1, wherein the gate comprises a silicon-containing material, a metal-containing material or a combination thereof.

9. A FinFET device, comprising:
   a substrate having at least one fin;
   a gate disposed across the at least one fin and having a narrow-middle profile that is narrow in a middle portion thereof, wherein the middle portion of the gate is no higher than half of a height of the gate,
   wherein the gate further has a top portion and a bottom portion that are wider than the middle portion, and a critical dimension of the top portion is greater than a critical dimension of the bottom portion.

10. The FinFET device of claim 9, further comprising spacers on sidewalls of the gate, wherein the spacers comprise a nitrogen-containing dielectric material, a carbon-containing dielectric material or both, and the spacers have a dielectric constant less than about 10.

11. The FinFET device of claim 10, further comprising source/drain regions at two sides of the gate, wherein sidewalls of the source/drain regions in the substrate are inclined away from bottoms of the spacers.

12. The FinFET device of claim 11, further comprising contacts above the source/drain regions, wherein bottom surfaces of the contacts are no higher than the middle portion of the gate.

13. A method of forming a FinFET device, comprising:
   providing a substrate with at least one fin;
   forming a dummy layer on the substrate covering the at least one fin;
   forming a mask layer on the dummy layer;
   performing at least one main etching step and at least one lateral etching step to the dummy layer by using the mask layer as an etch mask, so as to form a dummy gate with a narrow-middle profile and a substantially smooth sidewall contour;
   forming source/drain regions at two sides of the dummy gate; and
   replacing the dummy gate with a gate, wherein the gate comprises a bottom portion, a middle portion and a top portion, wherein a critical dimension of the middle portion is smaller than each of a critical dimension of the bottom portion and a critical dimension of the top portion, and the critical dimension of the top portion is greater than the critical dimension of the bottom portion.

14. The method of claim 13, wherein each of the at least one main etching step and the at least one lateral etching step comprises an anisotropic etching, an isotropic etching, a reactive ion etching (RIE) process, or a combination thereof.

15. The method of claim 13, further comprising, after the step of forming the dummy gate and before the step of forming the source/drain regions, forming spacers on sidewalls of the dummy gate, wherein the spacers comprise a nitrogen-containing dielectric material, a carbon-containing dielectric material or both, and the spacers have a dielectric constant less than about 10.

16. The method of claim 15, wherein the spacers are formed conformally along the sidewalls of the dummy gate.

17. The method of claim 13, the step of replacing the dummy gate with the gate comprises:
   forming a dielectric layer aside the dummy gate;
   removing the dummy gate to form a trench in the dielectric layer; and
   forming the gate in the trench.

* * * * *